(12) United States Patent
Takeuchi et al.

(10) Patent No.: US 6,699,018 B2
(45) Date of Patent: Mar. 2, 2004

(54) CELL DRIVING TYPE MICROPUMP MEMBER AND METHOD FOR MANUFACTURING THE SAME

(75) Inventors: Yukihisa Takeuchi, Nishikamo-Gun (JP); Hiroyuki Tsuji, Nagoya (JP); Kazumasa Kitamura, Ichinomiya (JP); Nobuo Takahashi, Owariasahi (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/900,742

(22) Filed: Jul. 6, 2001

(65) Prior Publication Data

US 2002/0146329 A1 Oct. 10, 2002

(30) Foreign Application Priority Data

Apr. 6, 2001 (JP) .................................. 2001-108986
Jun. 22, 2001 (JP) .................................. 2001-189718

(51) Int. Cl.$^7$ .............................................. F04B 35/00
(52) U.S. Cl. ...................................... 417/322; 417/413.2
(58) Field of Search ............................... 417/322, 413.2

(56) References Cited

U.S. PATENT DOCUMENTS

| 5,307,311 | A | * | 4/1994 | Sliwa, Jr. ................... 365/174 |
| 5,542,821 | A | * | 8/1996 | Dugan ......................... 417/322 |
| 5,906,481 | A | * | 5/1999 | Ogawa et al. ............. 417/413.2 |
| 6,431,212 | B1 | * | 8/2002 | Hayenga et al. ............ 417/322 |

* cited by examiner

Primary Examiner—Cheryl J. Tyler
(74) Attorney, Agent, or Firm—Burr & Brown

(57) ABSTRACT

A micro pump member is provided, in which a plurality of cells formed in a base part are used as pressurizing chambers, and side walls forming the pressurizing chambers are constructed by piezoelectric/electrostrictive elements. The volume of the pressurizing chambers is changed by the displacement of the piezoelectric/electrostrictive elements to produce a pressure in the pressurizing chambers. The pressurizing chambers are formed independent of adjacent pressurizing chambers. Activation can be carried out by applying a driving electric field having a high field strength to the pressurizing chambers, so that a greater displacement and a higher response can be obtained with a smaller field strength.

16 Claims, 17 Drawing Sheets

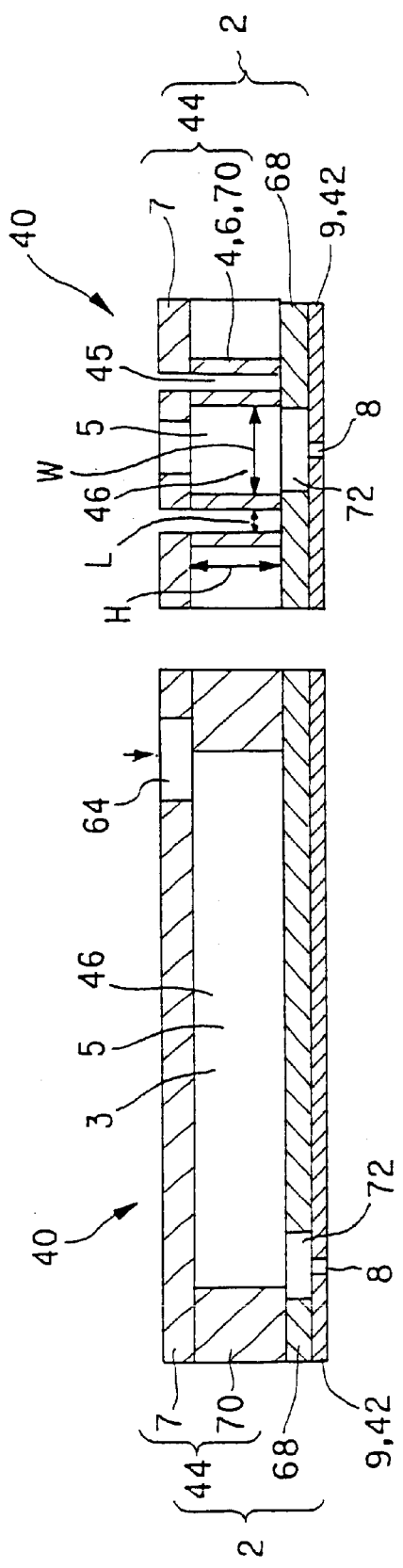

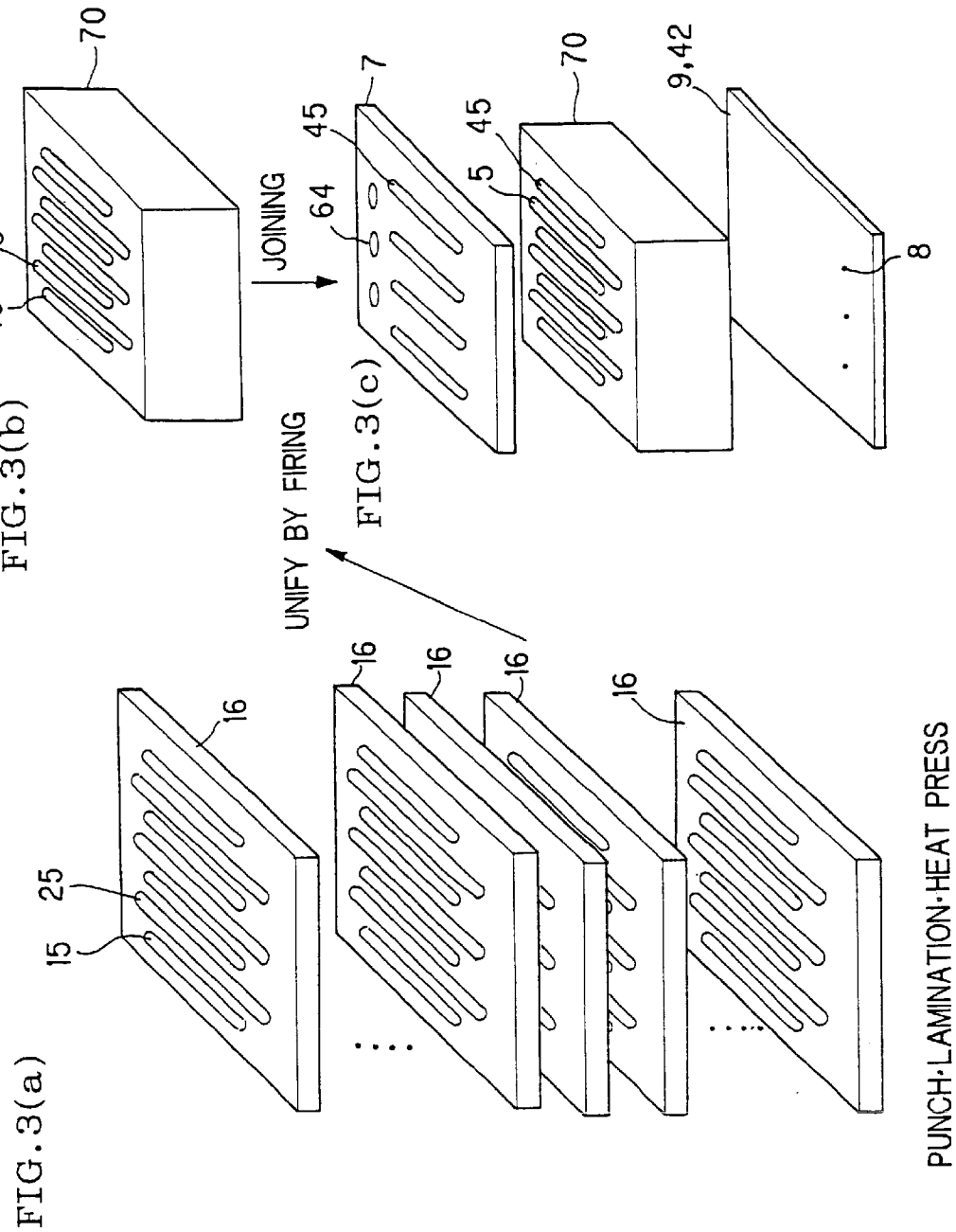

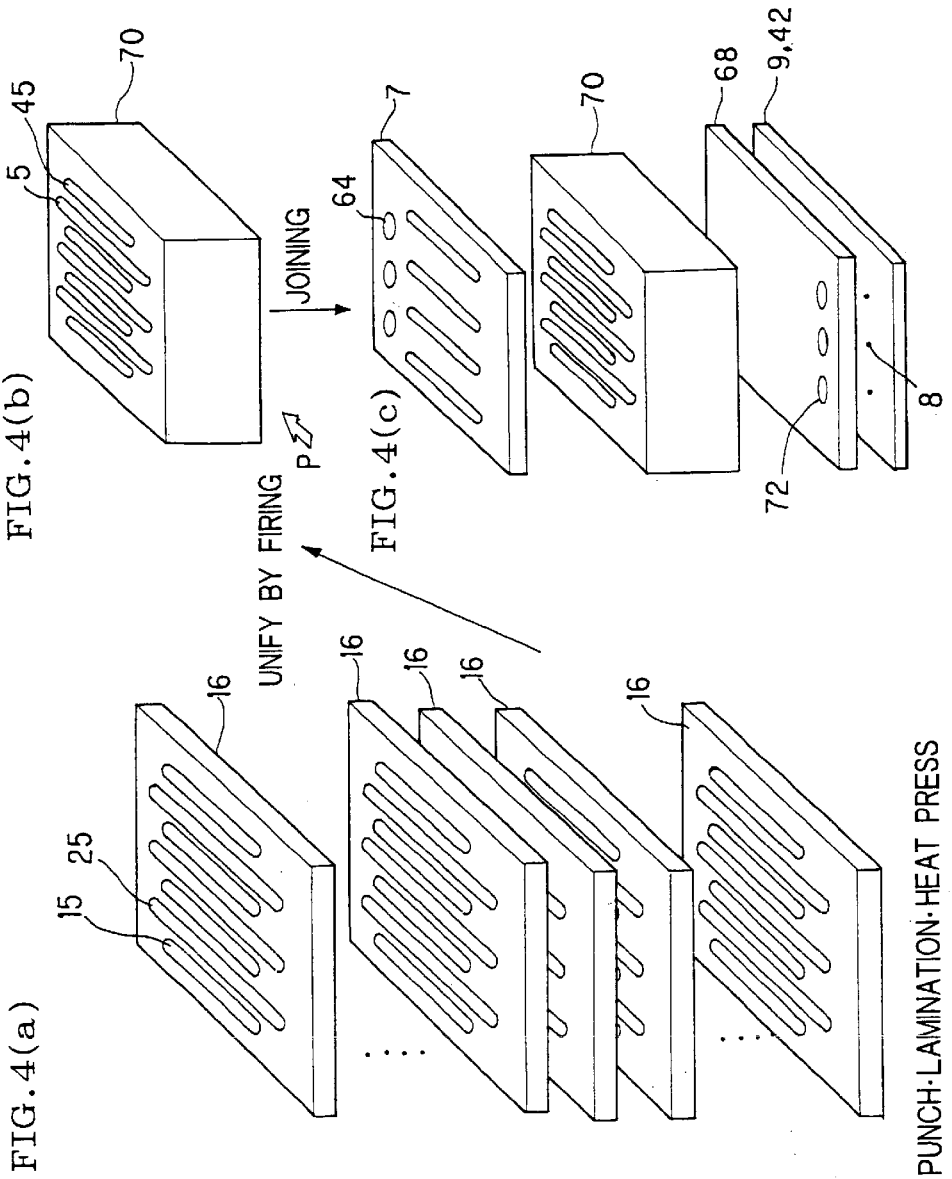

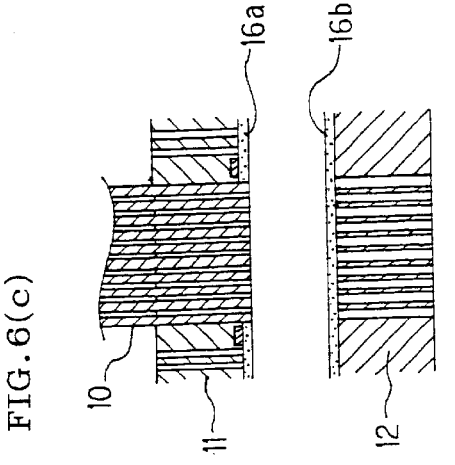
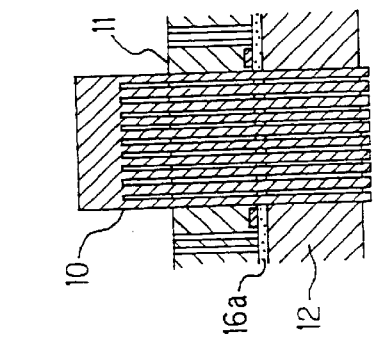
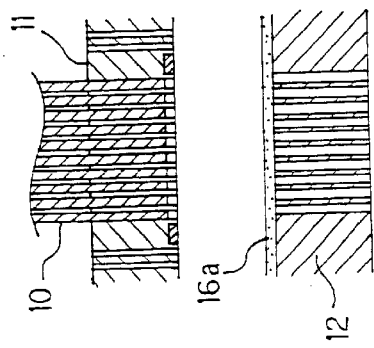
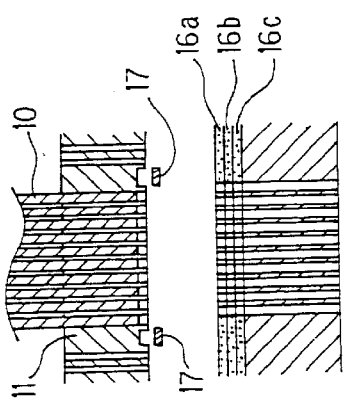
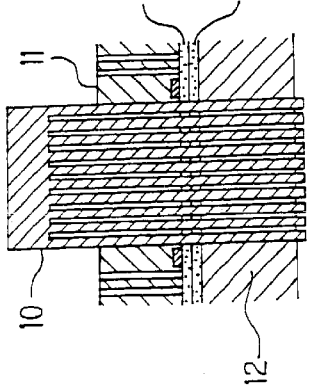

FIG.7 - PRIOR ART
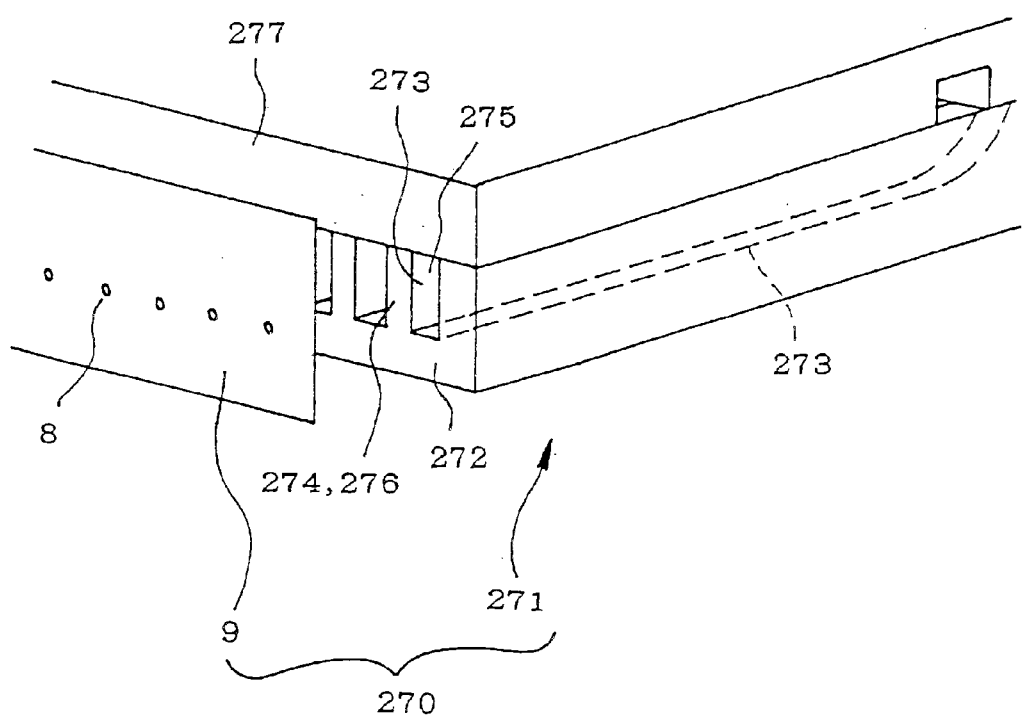

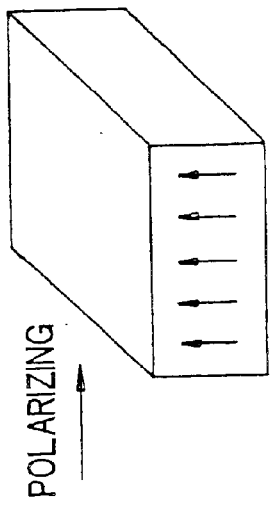
FIG.8(b) - PRIOR ART
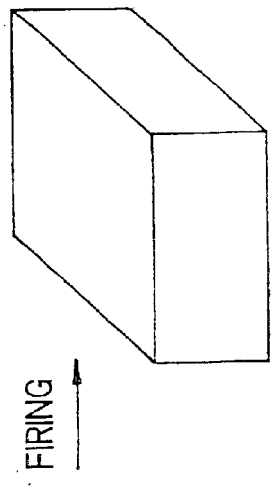
FIG.8(c) - PRIOR ART
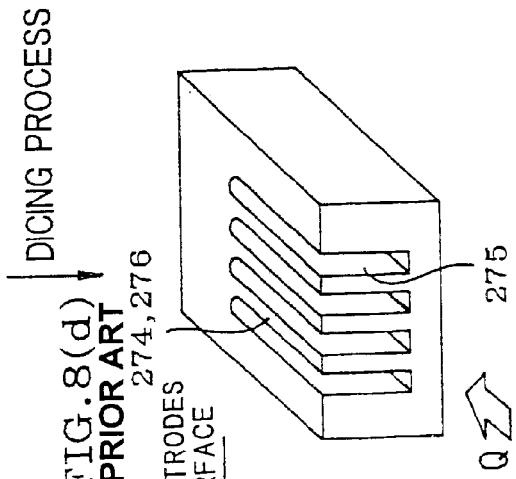
FIG.8(d) - PRIOR ART
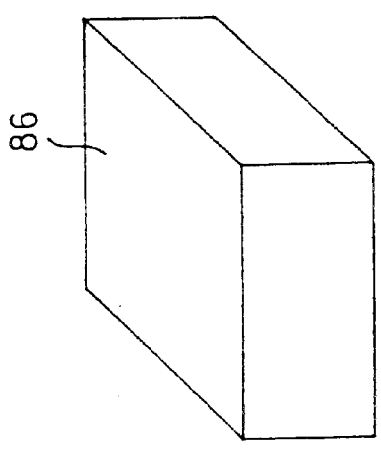
FIG.8(e) - PRIOR ART FIG.9(a) - PRIOR ART
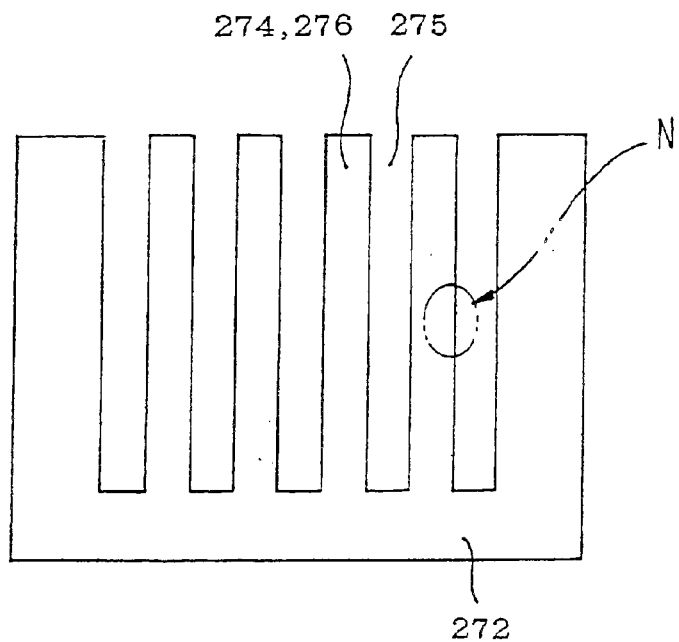
FIG.9(b) - PRIOR ART
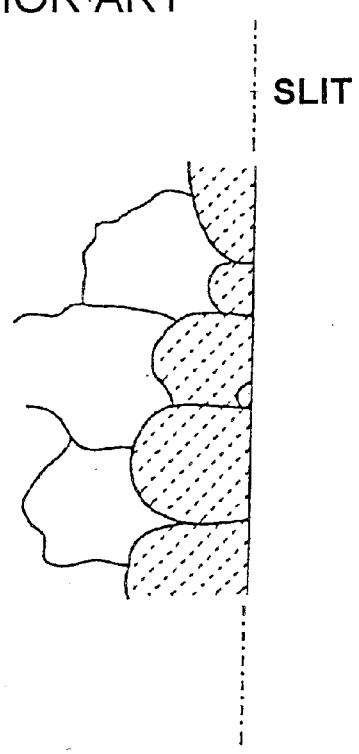

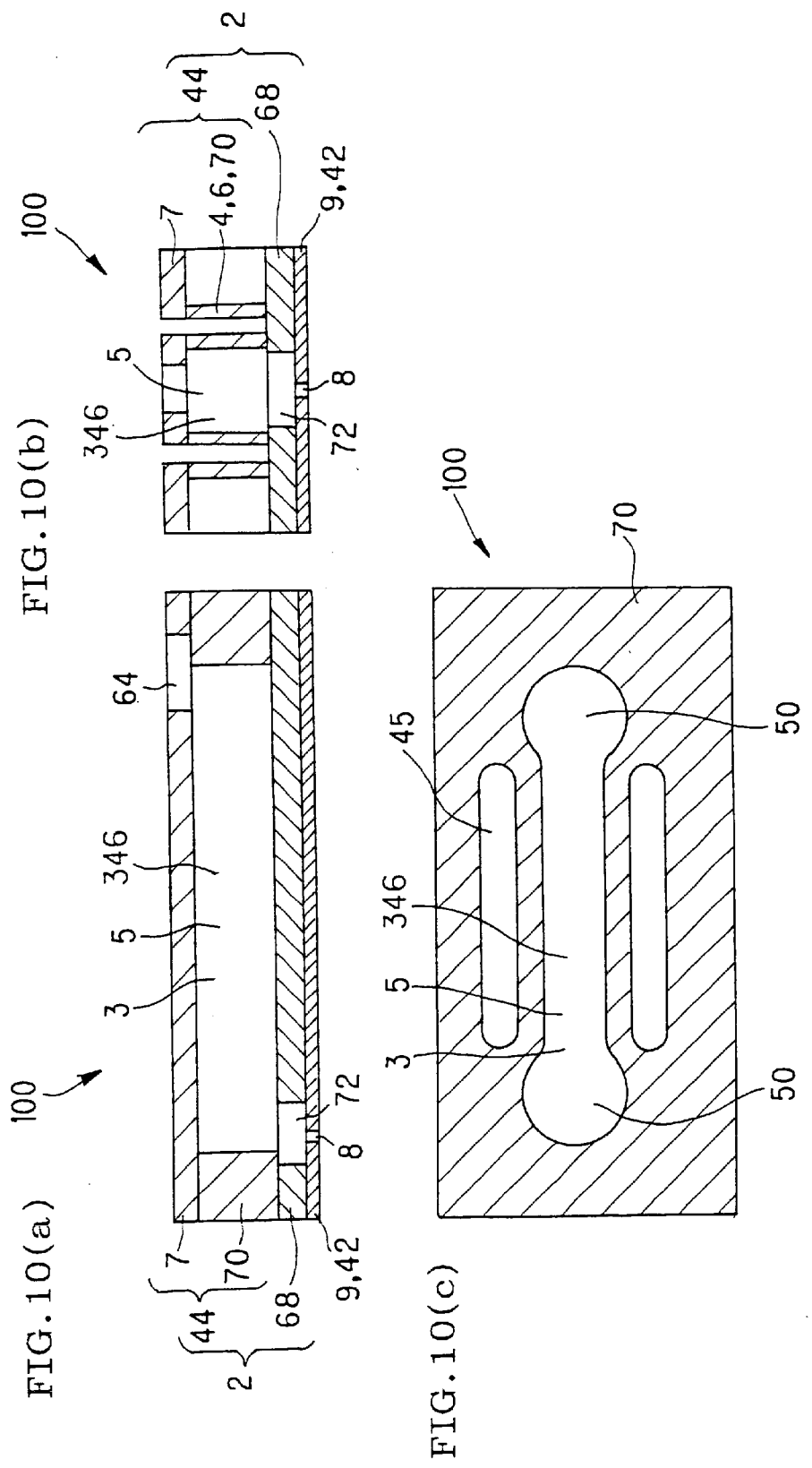

FIG.14
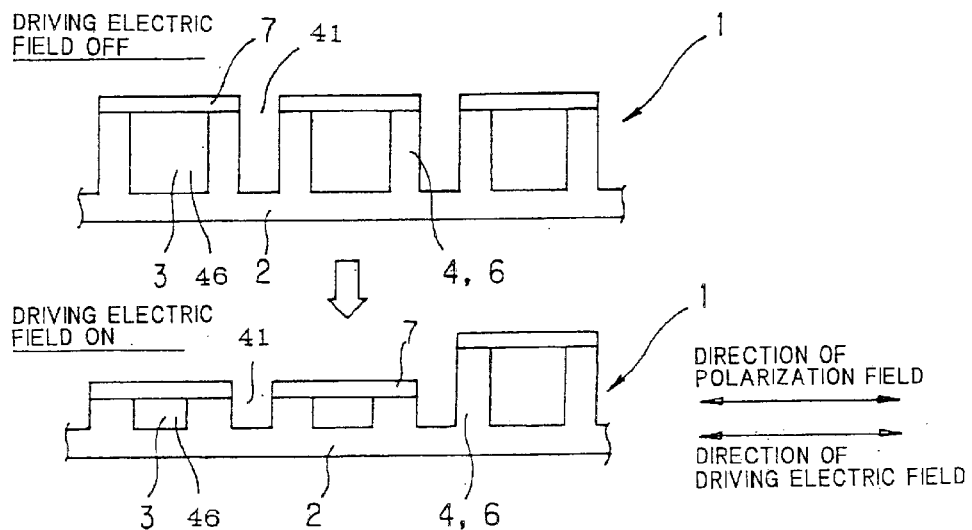
FIG.15 - PRIOR ART
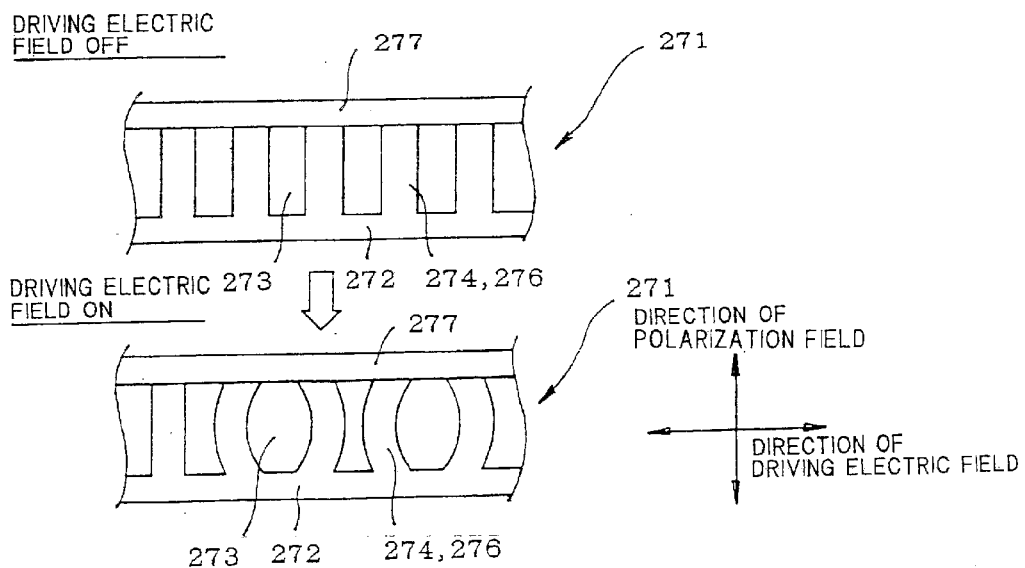

FIG. 16 - PRIOR ART
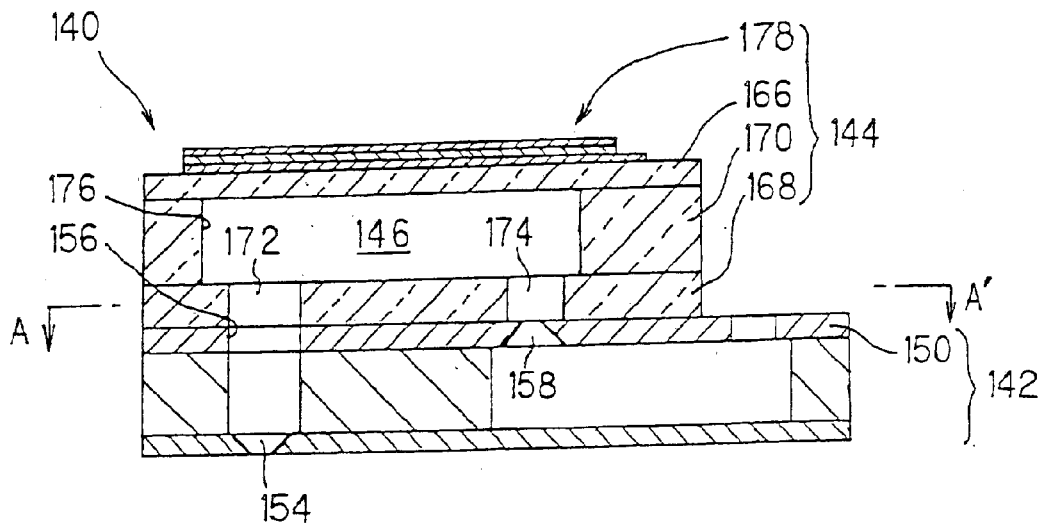
FIG. 17 - PRIOR ART
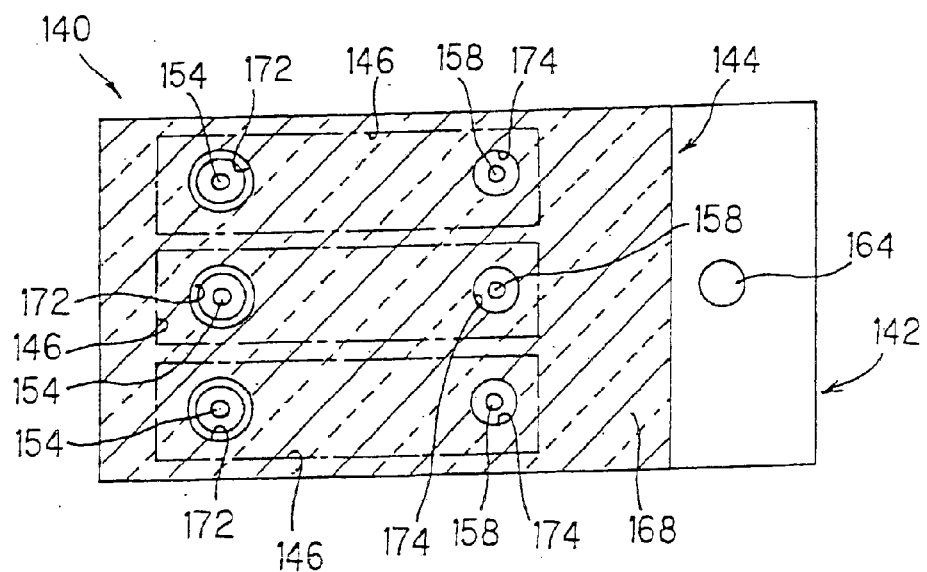

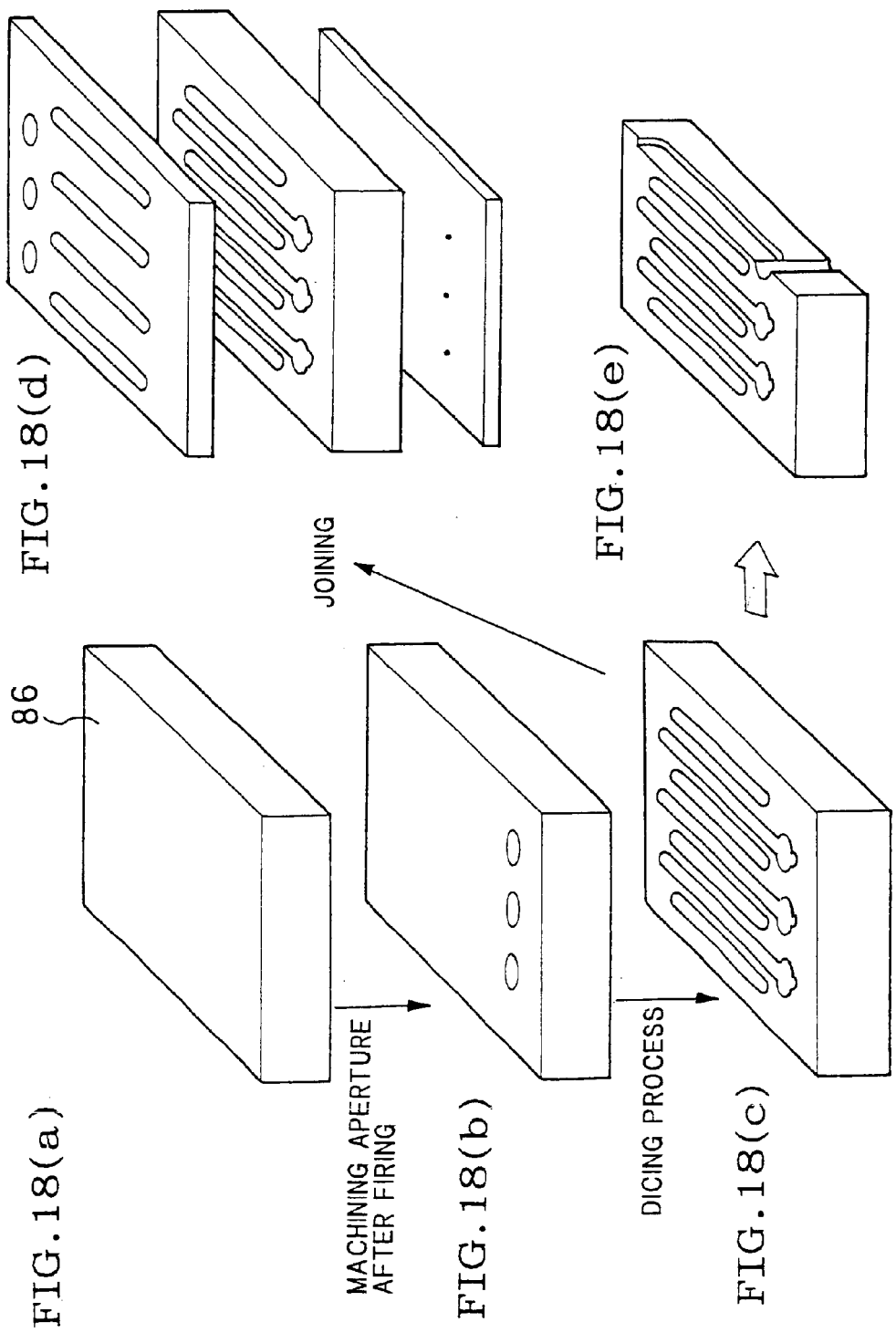

CELL DRIVING TYPE MICROPUMP MEMBER AND METHOD FOR MANUFACTURING THE SAME

BACKGROUND OF THE INVENTION AND RELATED ART

The present invention relates to a cell-driving-type micro pump member based on the piezoelectric/electrostrictive effect, more specifically to a cell-driving-type micro pump member having a high response and providing a high pressurizing force, wherein the micro pump includes separate cells whose side walls are made of piezoelectric/electrostrictive elements, and each cell is used as a pressurizing chamber, so that a pressure can be produced in the pressurizing chamber by changing the volume of the cell with the aid of the displacement of the piezoelectric/electrostrictive elements.

Recently, mechanisms providing a change of volume in a pressurizing chamber by deforming a part of the walls forming the pressurizing chamber with the aid of the piezoelectric/electrostrictive effect are known, where the mechanism increases the pressure in a small pressurizing chamber formed in a base part. Such a micro pump member is used, for instance, as an ink pump member or the like in a print head used in an ink jet printer, wherein the pressure in the pressurizing chamber, to which ink is supplied and then stored therein, is increased by the displacement of the piezoelectric/electrostrictive elements, so that the ink particles (droplets) are ejected from nozzle holes connected to the pressurizing chamber, and thus the printing can be carried out.

For instance, in JP-A-6-40030, an example of an ink jet print head as shown in FIG. 16 and FIG. 17 is described, wherein a micro pump member is used as an ink pump member. The ink jet print head 140 is formed by joining an ink nozzle element 142, an ink pump member 144 and a piezoelectric/electrostrictive element 178 to each other, to form a unified body. The ink, which is supplied to ink pressurizing chambers 146 (hereafter simply referred to as pressurizing chambers), is ejected through nozzle holes 154 in the ink nozzle member 142 by the bending deformation of a closing plate 166 (vibration plate) forming the pressurizing chamber 146 in accordance with the deformation of the piezoelectric/electrostrictive element 178, thus inducing a pressure in the pressurizing chamber 146.

The ink pump member 144 is formed as a unified body, in detail, with such a construction that the closing plate 166 and a connecting plate 168, each of which has a planar shape, are superimposed each other sandwiching a spacer blade 170 therebetween. In the connecting plate 168, first connecting openings 172 and second connecting openings 174 are respectively formed at the positions corresponding to through-holes 156 and orifice holes 158 which are formed in an orifice plate 150 of the ink nozzle element 142. Moreover, a plurality of rectangle-shaped window parts 176 is formed in the spacer plate 170. The spacer plate 170 is superimposed on the connecting plate 168 in such a manner that each of the first connecting openings 172 and second connecting openings 174, which are disposed in the connecting plate 168 is opened to the corresponding window parts 176. In this spacer blade 170, moreover, the closing plate 166 is superimposed on the surface opposite that on which the connecting plate 168 is superimposed, so that the openings of the window parts 176 are closed at the closing plate 166. By so doing, the pressurizing chambers 146, which are connected to the outside via the first and second connecting openings 172, 174, are formed in the inside of the ink pump member 144.

In such an ink jet print head 140, however, there are the following problems. In order to provide a greater displacement so as to be able to eject a greater number of droplets, it is effective to decrease the thickness of the closing plate 166 (vibrating plate) in the ink pump member 144. However, this induces a decrease in the rigidity and reduces the high responsiveness. On the other hand, a significant enhancement in the high responsiveness requires an increase in the rigidity. For this purpose, it would be effective to increase the thickness of the closing plate 166 (vibrating plate), but this treatment provides a reduced displacement, thereby making it impossible to eject the required number of droplets. That is, in the ink pump member, it is difficult to attain both a greater displacement and a higher response property by the bending deformation of the vibrating plate due to the displacement of the piezoelectric/electrostrictive element. This is the first problem.

As for the second problem, it has been found that if one wants to make the adjacent ink pump members the same action, the displacement is reduced compared with the case where the piezoelectric/electrostrictive element is singly driven; this results in failure to display the intrinsic characteristics. That is, the vibrating plates of two adjacent ink pump members are bent simultaneously, so that a pulling force is applied to the walls between the ink pump members, thereby making it difficult to bend the vibrating plates.

Although not shown in the drawings, it has been proposed in JP-A-6-350155 that the interference due to the mutual displacement of the piezoelectric/electrostrictive elements is suppressed by disposing a groove between a concave part (ink pressurizing chamber) and the adjacent concave part, that is, by disposing a groove between adjacent ink pump members.

Moreover, as for a micro pump member based on the known piezoelectric/electrostrictive effect, for instance, a micro pump member, which is driven in shear mode and is similarly used in an ink jet head, is employed. This is a micro pump 271 having such a structure as shown in FIG. 7, wherein a plurality of piezoelectric/electrostrictive elements as comb teeth 276, that is, driving parts 274, are arranged like teeth of a comb on a base plate 272, and cells 273 having substantially rectangular form are formed by a closing slit 275 between the comb teeth with a cover plate 277. The openings at the front end of the micro pump member 271 are closed by a nozzle plate 9 having nozzles 8, so that an ink jet head 270 is formed so as to use the cells 273 as pressurizing chambers. By applying a driving electric field in a direction vertical to the direction of polarizing field in the driving parts 274, that is, comb teeth 276, consisting of the piezoelectric/electrostrictive material, the comb teeth 276 are deformed and thus the volume of the cells 273 are changed, thereby enabling the ink stored in the cells 273 to be ejected. Furthermore, the method of driving where the displacement results from the driving electric field in the direction vertical to the direction of polarization in the piezoelectric/electrostrictive elements is called the shear mode method.

Such a micro pump member 271 is manufactured according to the steps shown in FIG. 8(a)–FIG. 8(e). Firstly, a piezoelectric/electrostrictive material 86 is provided as shown in FIG. 8(a), and fired in FIG. 8(b). In FIG. 8(c), the polarization treatment is carried out and in FIG. 8(d), fine slits are formed with a dicing saw or the like, and driving parts 274 are arranged like the teeth of a comb in a regular form by interposing therebetween a plurality of slits 275 corresponding to respective spaces for storing the ink, and then electrodes are formed on the wall surfaces in the slits 275 in FIG. 8(e). After that, as shown in FIG. 7, the cover plate 277 comprising a glass plate or the like is mounted, and then the openings at the front end of the comb teeth are closed with the nozzle plate 9 having the nozzles 8, so that the cells 273 used as the pressurizing chambers are formed.

In such a manufacturing method, however, there are the following problems due to machining rigid, fired piezoelectric/electrostrictive materials: The first problem is that it is time-consuming to machine the slits with the dicing saw or the like, and therefore it is unsuitable for mass production.

Furthermore, the second problem is the cost increase. This is because sufficient cleaning is required after machining since the products are polluted with the free grinder particles for processing and the process liquid; this would require complex cleaning processes to clean them in a satisfactory manner due to the reduced strength after machining, with necessarily accompanying the process for drying, and facilities for both treating water for cleaning and exhausted water and the management thereof as well.

The third problem is that the slits forming the cells used as pressurizing chambers are restricted by the thickness of the dicing blade used for machining, so that a width of approximately 60 $\mu$m or less cannot be realized. Additionally, the thickness of the comb teeth, that is, the driving parts, also has a limitation regarding the depth of the slits so that the required grinding force for the dicing blade is obtained, and it is difficult to form cells or pressurizing chambers having a high aspect ratio of, for example, 10 or more, so that it is difficult to obtain a high power micro pump member having a high density or a high strength.

Generally, the aspect ratio is denoted by the ratio of the diameter to the axial length, in the case of an aperture having a cylindrical form. If the aperture has a non-cylindrical form, such as that shown in FIG. 8(d), i.e., in the case of the slit 275, which is later closed and thus becomes a cell (pressurizing chamber), the aspect ratio is denoted by the ratio of the shortest spacing between two comb teeth forming the slit 275, the comb teeth facing each other, that is, the width of the slit 275 to the depth of the slit 275. A pressurizing chamber having a high aspect ratio implies a pressurizing chamber whose height is greater compared with the inside width.

The fourth problem is that machining with a dicing blade only allows the production of straight and flat slits, so that a subsequent process for adhering parts is required if one wants the cells (the pressurizing chamber), to have a complex form. Moreover, since electric stress deformation rises up to the joint end of the slit plates when activated as a result of the straight machining, the durability of the joint surfaces is liable to be reduced therefrom.

The fifth problem is that, since the slit is formed with the grinding process after firing, micro cracks and fractures inside the grains of the piezoelectric/electrostrictive particles often occur at the side surface of the comb-like driving parts 274, and the characteristics of the cells are liable to be deteriorated. FIG. 9(a) and FIG. 9(b) are drawings illustrating this fact: FIG. 9(a) is a side view from Q in FIG. 8(d) and FIG. 9(b) is a magnified section of part N in FIG. 9(a). In the case of the grinding process with the dicing saw, either micro cracks from the machining or particles fractured in the grains result, on the side surface of comb-like driving parts 274 (teeth 276 of a comb), the particles thus have deteriorating properties, so that when the cell is driven, the performance inherent in the material cannot be obtained, and the micro cracks propagate, thereby damaging the device itself.

In the conventional micro pump member 271, moreover, problems occur as a result of the driving in the shear mode. The sixth problem is that after firing and carrying out the polarizing treatment, manufacturing processes involving heating to a temperature of the Curie temperature or higher caused the polarization in the piezoelectric/electrostrictive material and cannot be applied. As a result, in the case of fixing/wiring the micro pump members to a circuit board, the soldering process using the reflow-soldering method or adhesion under heating cannot be applied, due to the thermal restriction, and the throughput is reduced, thereby increasing the cost of manufacturing. Moreover, either laser machining or machining generating heat is also restricted.

Moreover, as for the seventh problem, it is noted that since the driving electric field is generated in the direction vertical to the direction of polarization field, activation with a high field strength, which causes the change in the state of polarization, is not permitted, so that a greater amount of strain cannot be obtained. If, however, a high driving electric field is generated, the state of polarization gradually changes during the driving period, hence, similarly reducing the amount of strain. As a result, the basic performance of the micro pump member deteriorates.

Moreover, in the conventional micro pump member 271, problems occur as a result of the structure in which the base plate, driving parts and cover plate are unified into one body, along with the problems which occur as a result of the above-mentioned manufacturing method, that is, the problem due to driving in the shear mode.

The eighth problem is the difficulty in making the adjacent cells (pressurizing chambers) in the same action. FIG. 15 is a sectional view showing the states of deactivation and activation for the micro pump member 271 as an example. When the driving electric field is applied, that is, in the case of the OFF state, the driving parts 274 of the piezoelectric/electrostrictive elements are not deformed, whereas when the driving electric field is applied to a specified driving part 274, that is, in the case of the ON state, the driving part 274 is deformed. As can be seen in FIG. 15, the driving part 274 acts as the driving elements for two cells 273, so that when the volume of the one cell increases, the volume of the adjacent cells decreases. When, for instance, the micro pump member 271 is used as the ink jet head 270 shown in FIG. 7, ink cannot be simultaneously ejected from the adjacent cells, that is, the pressurizing chambers. As a result, at least two actions are required to spray ink to an article to be sprayed in the minimum spacing between the ink jet head and the article. This is undesirable in view of enhancing speed in the ink ejecting process.

SUMMARY OF THE INVENTION

In view of the above-mentioned problems, an object of the present invention is to provide a micro pump member and a method for manufacturing the micro pump member, wherein a heating process at a higher temperature can be applied; mass production can be carried out at low cost; slit parts have cells having a shape inclusive of any shape other than shapes defined by straight lines; the slit parts have cells whose width is 60 $\mu$m or less, and the cells have a high aspect ratio; an activation with a high field strength is feasible; furthermore, a greater displacement and a higher response can be attained with a smaller field strength.

After studying micro pump members and the methods for manufacturing the member, it was found that the objects can be attained by the micro pump member and the manufacturing method described below.

Namely, the present invention provides a cell-driving-type micro pump member wherein a plurality of cells formed in the inside of a base part is used as pressurizing chambers, the side walls forming the pressurizing chambers are constituted by the piezoelectric/electrostrictive elements, a pressure in the cells is produced by changing the volume of the pressurizing chambers due to the displacement of the piezoelectric/electrostrictive elements, characterized in that the pressurizing chambers are formed independently of the adjacent pressurizing chambers.

In the cell-driving-type micro pump member according to the invention, it is desirable that the base part comprises a spacer plate consisting of the piezoelectric/electrostrictive elements in which a plurality of slits A are formed, a cover plate covering slits A on one side of the spacer plates, and a connecting plate covering the slits A on the other side of the spacer plates, wherein slits B, which pass through the cover plates and spacer plates, are formed between a slit A and the adjacent slits A.

Moreover, it is desirable that the polarizing field of the piezoelectric/electrostrictive elements and the driving electric field are aligned in the same direction. It is desirable that electrode layers are formed on both surfaces of side walls forming respective pressurizing chambers, and the side walls are expanded or constricted in the upward or downward direction by applying a voltage to the electrode layers.

In the cell-driving-type micro pump member of the present invention, it is desirable that the transgranular fracture of crystal grains is 1% or less, and the degree of profile for the surfaces of the pressurizing chambers is approximately 8 μm or less. Moreover, it is desirable that the ratio of the inside width to the height of the pressurizing chamber is approximately 1:2–1:40, and the ratio of the spacing between the pressurizing chamber and the adjacent chamber and the height of the pressurizing chamber is approximately 1:2–1:40.

Moreover, it is desirable that the inside width of the pressurizing chamber is approximately 60 μm or less, and that the spacing between the pressurizing chamber and the adjacent pressurizing chamber is approximately 50 μm or less. It is desirable that the surface roughness Rt of side walls forming the pressurizing chamber is approximately 10 μm or less.

In the cell-driving-type micro pump member of the present invention, it is desirable that, in accordance with the application, there may exist at least two distances different from each with respect to the inside width of the pressurizing chambers or the spacing between the pressurizing chamber and the adjacent chamber. Moreover, it is desirable that the pressurizing chambers have a reservoir at least at one axial end of the cell.

According to the present invention, a liquid discharging device is provided, including a cell-driving-type micro pump member used therein, wherein a liquid connecting opening is disposed on one surface of the pressurizing chambers and a liquid supplying opening is disposed at the other surface of the pressurizing chambers, and a liquid nozzle member having a plurality of nozzle holes for discharging the particles consisting of droplets is superimposed on one side of the cell-driving-type micro pump member in such a manner that the nozzle holes are connected to the pressurizing chambers. When a driving electric field is applied in the same direction as that of the polarizing field of the piezoelectric/electrostrictive elements, the pressurizing chambers are deformed by expanding/contracting the side walls of the pressurizing chambers consisting of piezoelectric/electrostrictive elements in the upward/downward direction, so that the liquid supplied to the pressurizing chambers can be discharged from the nozzle holes to one side.

Moreover, a liquid discharging device is provided, including a cell-driving-type micro pump member used therein, wherein a liquid supplying opening and a liquid connecting opening are disposed on one surface of the pressurizing chambers. A liquid supplying channel is connected to the liquid supplying opening on one surface of the cell-driving-type micro pump member, and a liquid nozzle member having a plurality of nozzle holes for discharging the particles of droplets is superimposed on one surface in such a manner that the nozzle holes are connected to the pressurizing chambers. When a driving electric field is applied in the same direction as that of the polarizing field of the piezoelectric/electrostrictive elements, and the pressurizing chambers are deformed by expanding/contracting the side walls of the pressurizing chambers consisting of piezoelectric/electrostrictive elements in the upward/downward direction, the liquid supplied to the pressurizing chambers can be discharged from the nozzle holes to one side.

In the liquid discharging device, it is desirable that one surface of the pressurizing chambers is the lower surface and the other surface of the pressurizing chambers is the upper surface, and the liquid supplied to the pressurizing chambers can be discharged from the nozzle holes in the direction toward the lower surface.

Furthermore, two methods for manufacturing the cell-driving-type micro pump member according to the present invention are provided, as shown below. The first manufacturing method is a method for manufacturing the cell-driving-type micro pump member using a punch and a die, wherein the pressurizing chambers which are a plurality of cells formed in the inside of a base part, and whose side walls comprise piezoelectric/electrostrictive elements, are formed to be independent of the adjacent pressurizing chambers. The first method is characterized in that it comprises the steps of; providing a plurality of green sheets made of piezoelectric/electrostrictive elements; positioning and then laminating all the green sheets after slit apertures are machined in all the green sheets (denoted by the lamination after punching); and forming piezoelectric/electrostrictive elements in which a plurality of slits are formed.

The second manufacturing method is a method for manufacturing the cell-driving-type micro pump member using a punch and a die, wherein the pressurizing chambers which are a plurality of cells formed in the inside of a base part, and whose side walls comprise piezoelectric/electrostrictive elements, are formed to be independent of the adjacent pressurizing chambers. The second method is characterized in that it comprises the steps of; providing a plurality of green sheets made of piezoelectric/electrostrictive elements; performing a first step for machining first slit apertures in the first green sheet with the punch, a second step for moving the first green sheets upwards into tight contact with a stripper in the state of the punch not being withdrawn from the first slit apertures, and a third step for moving the punch upwards in such a way that the front end of the punch is withdrawn slightly from the lowest part of the first green sheet moved upwards; performing a fourth step for machining second slit apertures in the second green sheet, a fifth step for moving the second green sheet upwards together with the first green sheet in the state of the punch not being withdrawn, and a sixth step for moving the punch upwards in such a way that the front end of the punch is slightly withdrawn from the lowest part of the second green sheet moved upwards; then, laminating the green sheets by repeating the fourth step to the sixth step (denoted by the simultaneous punch and lamination), and then forming piezoelectric/electrostrictive elements in which a plurality of slits is formed.

BRIEF DESCRIPTION OF THE DRAWINGS

FIGS. 1(a) and 1(b) are sectional views of an embodiment of a cell-driving-type micro pump member according to the invention.

FIGS. 3(a) to 3(c) are schematic drawings showing an embodiment of a process in a method for manufacturing a cell-driving-type micro pump member according to the invention.

FIGS. 4(a) to 4(c) are schematic drawings showing another embodiment of the process in a method for manufacturing a cell-driving-type micro pump member according to the invention.

FIG. 5(a) is a side view from P in FIG. 4(b), and FIG. 5(b) schematically shows an magnified section of part M in FIG. 5(a).

FIGS. 6(a) to 6(e) are drawings explaining an embodiment of the process for simultaneously punching and laminating the green sheets shown in FIG. 4(a); FIG. 6(a) shows a preparation step for laying a first green sheet on the die; FIG. 6(b) shows a step for punching the first green sheet; FIG. 6(c) shows a preparation process for laying a second green sheet on the first green sheet; FIG. 6(d) shows a step for punching the second green sheet; and FIG. 6(e) is a drawing showing a final punching completing step for punching all the sheets, completing the lamination and removing the laminated green sheets with a stripper.

FIG. 7 is a perspective view of an embodiment of an ink jet head equipped with a conventional micro pump member.

FIGS. 8(a) to 8(e) are schematic drawings for explaining an embodiment of a method for manufacturing a conventional micro pump member.

FIGS. 9(a) and 9(b) are drawings showing the conventional method for manufacturing a cell-driving-type micro pump member shown in FIG. 8(a)–FIG. 8(e); FIG. 9(a) is a side view from Q in FIG. 8(d), and FIG. 9(b) schematically shows a magnified section of part N in FIG. 9(a).

FIGS. 10(a) to 10(c) are sectional views of an embodiment of a cell-driving-type micro pump member according to the invention.

FIG. 14 shows sectional views of an embodiment of a cell-driving-type micro pump member according to the invention in the deactivated and activated states.

FIG. 15 shows sectional views of an embodiment of a micro pump member of the conventional art in the deactivated and activated states.

FIG. 16 is a sectional view of an embodiment of a micro pump member in the conventional art.

FIG. 17 is a sectional view of another embodiment of a micro pump member of the conventional art, and shows a sectional view from AA' in FIG. 16.

FIGS. 18(a) to 18(e) are drawings showing an embodiment of a process for manufacturing a cell-driving-type micro pump according to the invention by utilizing the conventional manufacturing method.

DETAILED DESCRIPTION OF THE INVENTION

Figure 2A:
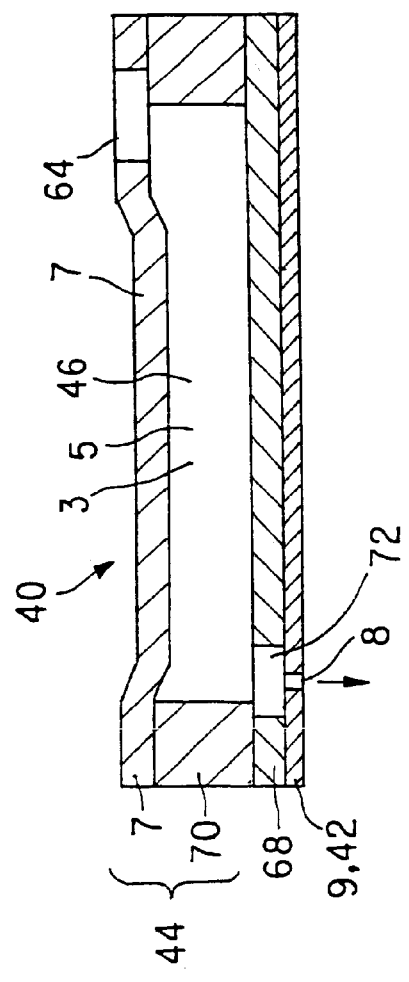
FIGS. 2(a) and 2(b) are sectional views of the embodiment of a cell-driving-type micro pump member according to the invention (activation state).

Next, referring to the drawings, various embodiments will be specifically explained regarding a cell-driving-type micro pump member and a method for manufacturing the micro pump member. However, the present invention is not restricted to the above. Various changes, revisions and modifications are possible on the basis of the knowledge of a person skilled in the art, unless these are outside of the scope of the invention. In the description, moreover, activating the micro pump member means driving at least one cell, i.e., producing a pressure in a pressurizing chamber. Producing a pressure in the pressurizing chamber means that the driving parts, i.e., side walls consisting of the pressurizing chambers, are deformed by applying a driving electric field thereto, thereby inducing a change in the volume of the pressurizing chambers and thus providing a pressurized state or a depressurized state in the pressurizing chambers.

Figure 2B:
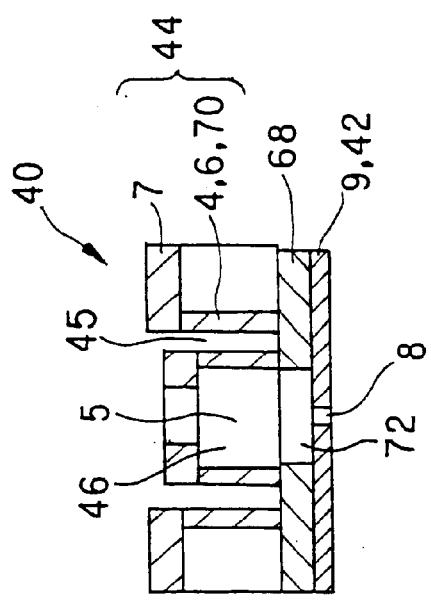

FIG. 1(a), FIG. 1(b), FIG. 2(a), and FIG. 2(b) are sectional views of an embodiment of a cell-driving-type micro pump member according to the present invention. FIG. 1(a) shows a longitudinal section of a pressurizing chamber 46 in the cell-driving-type micro pump member 44, and FIG. 1(b) shows a transverse section of the pressurizing chamber 46 in the cell-driving-type micro pump member 44. FIG. 2(a) and FIG. 2(b) show longitudinal and transverse sections in the activated state.

In the cell-driving-type micro pump member 44, a plurality of cells 3 formed inside a base part 2 is used as the pressurizing chambers 46, and side walls 6 forming the pressurizing chambers 46 are constituted by piezoelectric/electrostrictive elements, and a pressure is produced in the pressurizing chambers 46 by changing the volume of the pressurizing chambers 46 with the aid of the displacement of the piezoelectric/electrostrictive elements.

The base part 2 can be formed by a spacer plate 70 of the piezoelectric/electrostrictive elements forming a plurality of slits 5, a cover plate 7 covering the slits 5 on one side of the spacer plate 70, and a connecting plate 68 covering the slits 5 on the other side of the spacer plate 70. And, a slit 45 passing through the cover plate 7 and the spacer plate 70 is formed between one of the slits 5 and the adjacent slit 5 of the base part 2. The cell 3, that is, a pressurizing chamber 46, is formed by the slit 5 and the cover plate 7. Two adjacent pressurizing chambers 46 are isolated from each other by the slit 45.

For instance, a liquid connecting opening 72 is disposed on one surface of the pressurizing chamber 46 of the cell-driving-type micro pump member 44, and a liquid supplying opening 64 is disposed on the other surface of the pressurizing chamber 46. The liquid discharging device 40 is constructed by adjusting the position of the liquid connecting opening 72 with respect to a nozzle hole (hereafter denoted as a nozzle) with a liquid nozzle member 42 having nozzle holes in such a way that the nozzle holes are connected to the pressurizing chamber 46. Side walls 6 of the pressurizing chamber 46 made of piezoelectric/electrostrictive elements are expanded/constricted in the up/down direction by applying a driving electric field in the same direction as that of the polarizing field of the piezoelectric/electrostrictive elements. Thus, the pressurizing chamber 46 is deformed, so that the liquid supplied to the pressurizing chamber 46 can be discharged from the nozzle hole towards the side of one surface. The liquid nozzle member 42 can be a nozzle plate 9 having nozzles 8. In FIG. 1(a) and FIG. 1(b), it is shown that, for instance, one surface is the under face, and the other surface is the top face.

The liquid discharging device 40 can be employed in, for instance, a head of an ink jet printer, a micro droplet discharging apparatus used in the mixing and reaction treatment of a liquid of a small volume in the field of biotechnology, in the manufacturing of DNA chips necessary for analyzing the structure of a gene and in the coating process for semiconductor manufacturing, or an apparatus for spraying fuel, raw materials, etc.

In the cell-driving-type micro pump member 44 according to the present invention, a characteristic lies in the point that the pressurizing chamber 46 is formed independently of the adjacent pressurizing chamber 46 via the slit 45 without employing such a structure that the volume-changeable cells, that is, pressurizing chambers, are formed by a common cover plate, and a driving part is used as a driving part for two cells like in the case of the conventional micro pump member 271 as shown in FIG. 7.

A further characteristic lies in the point that the polarization field of the piezoelectric/electrostrictive elements constituting the side walls 6, that is, driving parts for the pressurizing chamber 46, is aligned in the same direction as that of the driving electric field. Moreover, a further characteristic lies in the point that electrode layers are formed on both sides of the side walls 6 forming the pressurizing chamber 46, and the side walls 6 are expanded/constricted in the up/down direction by applying a voltage to the electrode layers, without generating pressure by bending a closing plate (vibrating plate), that is, the upper wall constituting the pressurizing chamber, like as an ink pump member 144 as shown in FIG. 16.

As shown in FIG. 1(a) and FIG. 1(b), the slit 45 is formed between the pressurizing chamber 46 and the adjacent pressurizing chamber 46, so that these pressurizing chambers 46 are formed so as to be independent of one another. Due to this structure, the pressurizing chambers 46 can be activated independently of the other pressurizing chambers 46. In addition, the same action can be obtained for the adjacent pressurizing chambers 46, thereby enabling the piezoelectric/electrostrictive elements to be driven without being interfered with each other. Moreover, the slit 45 can be formed between adjacent pressurizing chambers 46 in such a manner that it does not disturb the deformation of driving parts 4, that is, the side walls 6. For instance, as can be taken from the activated state in FIG. 2(a), the slit 45 can be formed such that the slit 45 has substantially the same length as that of at least the deformable part of the cover plate 7 in the axial direction of the pressurizing chamber 46. More preferably the slit 45 is formed to have the same length as that of the pressurizing chamber 46.

FIG. 14 shows sectional views of the cell-driving-type micro pump member 44 according to the invention in the deactivated and activated states. When no driving electric field is applied, that is, in the OFF state, the driving parts of the piezoelectric/electrostrictive elements are not deformed, whereas when a driving electric field is applied to a specified driving part 4, the driving part 4 is deformed. In this case, the pressurizing chambers 46, that is, the cells 3, are formed in the base part 2 so as to be separated from each other via the slit 45. Accordingly, the activation of the pressurizing chamber 46 and the activation of the adjacent pressurizing chamber 46 can be performed independently of each other without any restriction regarding the amount of deformation, thereby enabling the same action to be conducted for two adjacent pressurizing chambers 46, as shown in FIG. 14. As a result, a smaller field strength is required to obtain the same amount of deformation.

Moreover, the deformation, that is, the expansion/compression of the side walls 6, that is, the driving parts 4, provides a change in the volume of the pressurizing chamber 46, thus producing a pressure. As a result, it is unnecessary to form the driving parts 4 in a thin form in order to obtain a greater deformation, and there is no problem regarding the fact that a possible reduction of the response results from the reduced rigidity. A greater deformation and higher response can be attained without any sacrifice of either.

When, for instance, the cell-driving-type micro pump member 44 is used as the above-mentioned liquid discharging device 40, liquid can be simultaneously discharged from adjacent pressurizing chambers. Since liquid can be ejected to an article to be sprayed with a minimum spacing between the device and the article, the frequency of activation for the pressurizing chambers can be reduced, compared with those in the conventional art, thereby enhancing the rate of liquid discharge. If, for instance, the liquid discharging device 40 is employed in a production line of DNA chips, the cost of production can be greatly reduced.

Moreover, since the polarizing field of the piezoelectric/electrostrictive elements is aligned in the same direction as that in the driving electric field, it is not necessary to produce temporary or dummy electrodes for the polarization, or to apply an electric field thereto, thereby enhancing the throughput. Moreover, irrespective of the polarizing treatments, it is possible to employ a manufacturing process in which heating at a temperature of the Curie temperature or higher is carried out. Accordingly, in the case of fixing/wiring the micro pump member to, e.g., a circuit board, soldering with reflow solder or thermosetting adhesion are feasible, so that, inclusive of the process for manufacturing a product in which the micro pump member is used, the throughput can further be enhanced, thus reducing the cost of production.

Moreover, even if an electric field having a high strength is applied to the driving parts, the state of polarization is not changed, rather a more desirable state of polarization can be obtained. Therefore, because a compact product can be obtained, it is desirable to use it as a micro pump member.

In the cell-driving-type micro pump member 44, it is desirable that the degree of profile for the surface of the side walls forming the pressurizing chamber is approximately 8 $\mu$m or less. It is desirable that the unevenness of the wall surface of the side walls forming the pressurizing chamber is approximately 10 $\mu$m or less. Moreover, it is desirable that the surface roughness Rt of the wall surface of the side walls forming the pressuring chamber is approximately 10 $\mu$m or less. The micro pump member fulfilling at least one of these conditions has a smooth surface for the side walls or driving parts forming the pressurizing chamber on the inside thereof, thereby neither the concentration of field nor the concentration of the stress arises, thus enabling a stable discharge operation to be performed for the respective pressurizing chambers.

In conjunction with the above, the degree of profile for a surface is given in Japanese Industrial Standard B0621: "the definition and representation of the geometrical deviation." The profile of a surface is a surface having a functionally specified shape, and the degree of profile for a surface is defined as the deviation of the surface contour from a geometrical contour, which is determined by a theoretically specified exact dimension. In the present invention, the surface of a cell implies the inside cell wall surface of the driving parts composing the cell.

In the cell-driving-type micro pump member 44 shown in FIGS. 1(a) and 1(b), the ratio of the inside width W to the height H of the pressurizing chamber, in other words, the aspect ratio W:H of the pressurizing chamber, is preferably approximately 1:2 to 1:40, and the inside width W of the pressurizing chamber is preferably approximately 60 $\mu$m or less. More preferably, the aspect ratio W:H of the pressurizing chamber is 1:10 to 1:25, and the inside width of the pressurizing chamber is 50 $\mu$m or less. The reason why those values are preferable is that the danger of dielectric breakdown would increase since a field sufficient to obtain a greater pressure would become too high if the aspect ratio is small, whereas the occurrence of defective products would increase during the assembling and handling period since the mechanical strength would decrease if the aspect ratio increases. A micro pump member fulfilling at least one of these conditions is preferred, and more preferably, a micro pump member fulfilling the two conditions is preferred, in other words, a thinner micro pump member having a greater height can easily provide a higher power with a higher density, thereby a more compact micro pump member can be realized.

Moreover, in the cell-driving-type micro pump member 44 shown in FIGS. 1(a) and 1(b), the ratio of the spacing between the pressurizing chamber and the adjacent pressurizing chamber to the height of the pressurizing chamber is preferably approximately 1:2 to 1:40, and the spacing between the pressurizing chamber and the adjacent pressuring chamber, that is, the spacing between pressurizing chambers is preferably approximately 50 $\mu$m or less. More preferably, the ratio of the spacing between the pressurizing chamber and the adjacent pressurizing chamber to the height of the pressurizing chamber is 1:10 to 1:25, and the spacing between pressurizing chambers is 30 $\mu$m or less. A micro pump member fulfilling at least one of these conditions is preferred, and more specifically a micro pump member fulfilling the two conditions is preferred, and includes a greater number of pressurizing chambers, although the pressurizing chamber and the adjacent pressuring chamber can be independently activated, thereby realizing a more compact micro pump member.

As a result, if the cell-driving-type micro pump member 44 according to the invention is used as, e.g., the liquid discharging device 40, the liquid can be simultaneously discharged from the adjacent pressurizing chambers 46, and can be ejected to an article to be sprayed at a higher density, compared with a conventional micro pump member having a structure where the driving part acts as a driving part for two cells.

In the cell-driving-type micro pump member according to the invention, the shape of the pressurizing chamber is not restricted. FIGS. 10(a)–10(c) are sectional views of an embodiment of a cell-driving-type micro pump member according to the invention. FIG. 10(a) shows a longitudinal section of a pressurizing chamber 346 of the cell-driving-type micro pump member 44, FIG. 10(b) shows a transverse section of the pressurizing chamber 346 of the cell-driving-type micro pump member 44, and FIG. 10(c) shows a horizontal section of the spacer plate 70 constituting the base part 2 of the cell-driving-type micro pump member 44. As can be taken from FIG. 10(c), it is also preferable that the pressurizing chamber 346 has reservoirs 50 at the axial ends. When a liquid discharging device 100 is constructed together with a liquid nozzle member 42 using the cell-driving-type micro pump member 44, the reservoirs 50 provide a tolerance regarding the positional deviation in adjusting the micro pump member with respect to the ink pump member, which is a problem encountered, in particular, when fine design of the member is necessary. An increased effect can be provided by having one reservoir 50 disposed at an end at least on the side of nozzle hole. If, however, the reservoirs 50 are disposed at both ends, a much more marked effect can be obtained in the case of designing in that fine holes requiring a high precision positioning are disposed on the liquid supplying side.

Figure 11:
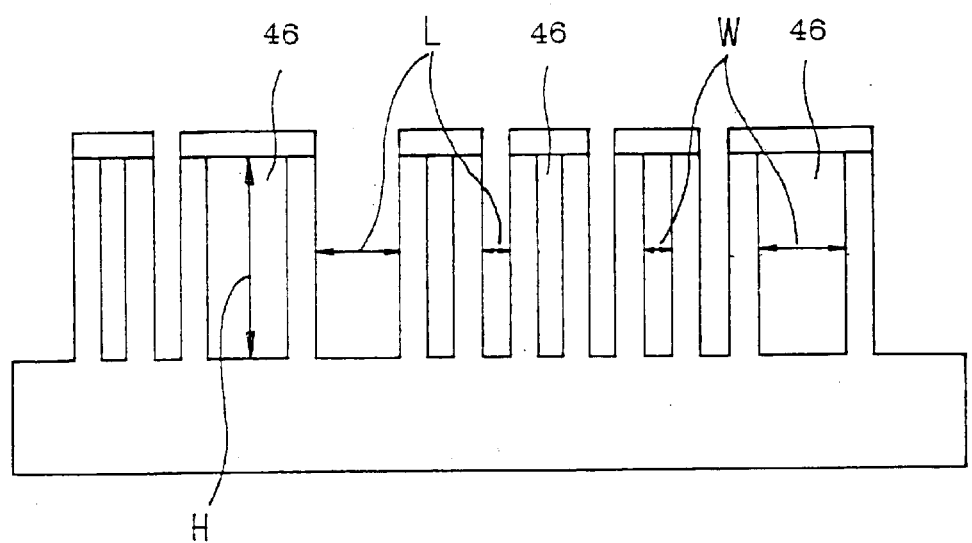
FIG. 11 is a sectional view of an embodiment of a cell-driving-type micro pump member according to the invention, which is applied to a liquid discharging device, where the cell width and the spacing between the cells are respectively not the same, but with at least two different distances.

Next, the cell-driving-type micro pump member according to the invention is further described with examples of application, referring to the drawings. FIG. 11 is a sectional view of an embodiment of the cell-driving-type micro pump member according to the invention, which is applied to a liquid-discharging device. The inside width of the pressurizing chamber 46, and the spacing between the pressurizing chamber 46 and the adjacent pressurizing chamber 46, that is, the spacing between pressurizing chambers, have a fixed distance, but with at least two different distances. As a result, a predetermined number of droplets can be ejected onto a desirable position of an object to be sprayed.

Figure 19:
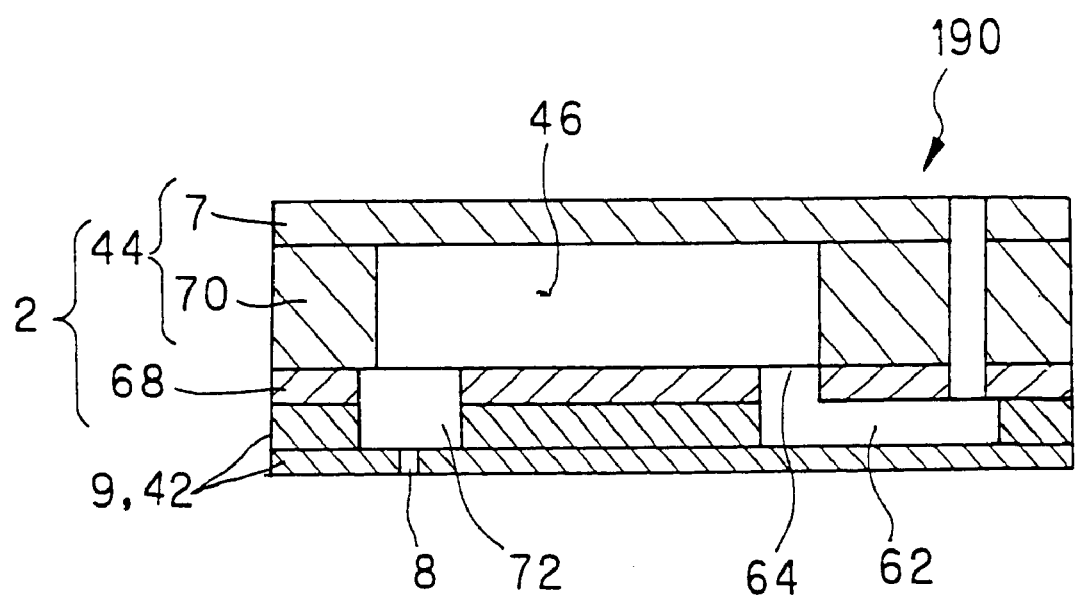
FIG. 19 is a sectional drawing showing another embodiment of a cell-driving-type micro pump according to the invention.

FIG. 19 is a sectional view of another embodiment in which the cell-driving-type micro pump member according to the invention is employed in a liquid discharging device. In the liquid discharging device to which the cell-driving-type micro pump member according to the invention is used, the procedure for supplying the liquid to the pressurizing chamber is not restricted to those in which the liquid supplying opening 64 is disposed on the top face as in the liquid discharging device 40 similar to the conventional ink jet print head.

A liquid discharging device 190, which is shown as an example in FIG. 19, has a liquid supplying channel. The liquid discharging device 190 is formed in such a manner that a liquid supplying channel 62 connected to a liquid supplying opening 64 is disposed on the under face of the cell-driving-type micro pump 44, in which the liquid supplying opening 64 and a liquid connecting opening 72 are disposed on one surface, e.g., on the under face of the pressurizing chamber 46, and liquid nozzles 42 having a plurality of nozzles for ejecting droplet particles are superimposed on each other in such a manner that the nozzle holes are connected to the pressurizing chamber 46.

Next, methods for manufacturing a cell-driving-type micro pump member according to the invention are described. There are two different manufacturing methods due to the difference in the processes for producing the piezoelectric/electrostrictive elements: Referring to FIGS. 4(a)–4(c), a process in the first method for manufacturing a cell-driving-type micro pump member is described in an exemplified manner. In this manufacturing method, a punch and a die are used. The manufacturing method includes the steps of; punching a predetermined number of green sheets 16 made of piezoelectric/electrostrictive material with the punch, in which case, slit apertures 25 which become the slits 5 after laminating, and slit apertures 15 which become the slits 45 after laminating, are formed in each green sheet as in FIG. 4(a); laminating these green sheets after positioning and providing piezoelectric/electrostrictive elements having a predetermined thickness. Then, for instance, as shown in FIG. 4(b), a spacer plate 70 which includes the desired slits 5 and slits 45 is formed after firing and unifying; and further forming of electrodes in the slits 5 which will become cells, that is, pressurizing chambers. Then, a cover plate 7, a connection plate 68 and a liquid nozzle member 42 are jointed to the spacer plate 70. In this case, the green sheets 16 can be formed by a known tape-forming means, such as the doctor blade method or the like.

The positioning of the green sheets in the lamination step can be carried out, either by sequentially superimposing one green sheet on another inside a frame having substantially the same inner shape as the outer shape of the green sheet, or by passing a guide pin through a pre-formed guide hole of the respective green sheets in the lamination procedure, and then, heating under pressure is carried out.

The manufacturing process shown in FIGS. 3(a)–3(c) corresponds to the process in the case that the connection plate 68 is not used, and is identical with those in FIGS. 4(a)–4(c), except for the above. The connection plate 68 prevents reduction of the pressurizing performance from the nozzle member by utilizing the connection plate 68 made of such a material having a higher rigidity, as a metal, ceramic or thick plastic material, when the nozzle member is made of such a material having a lower rigidity as a polyimide film.

Figure 12:
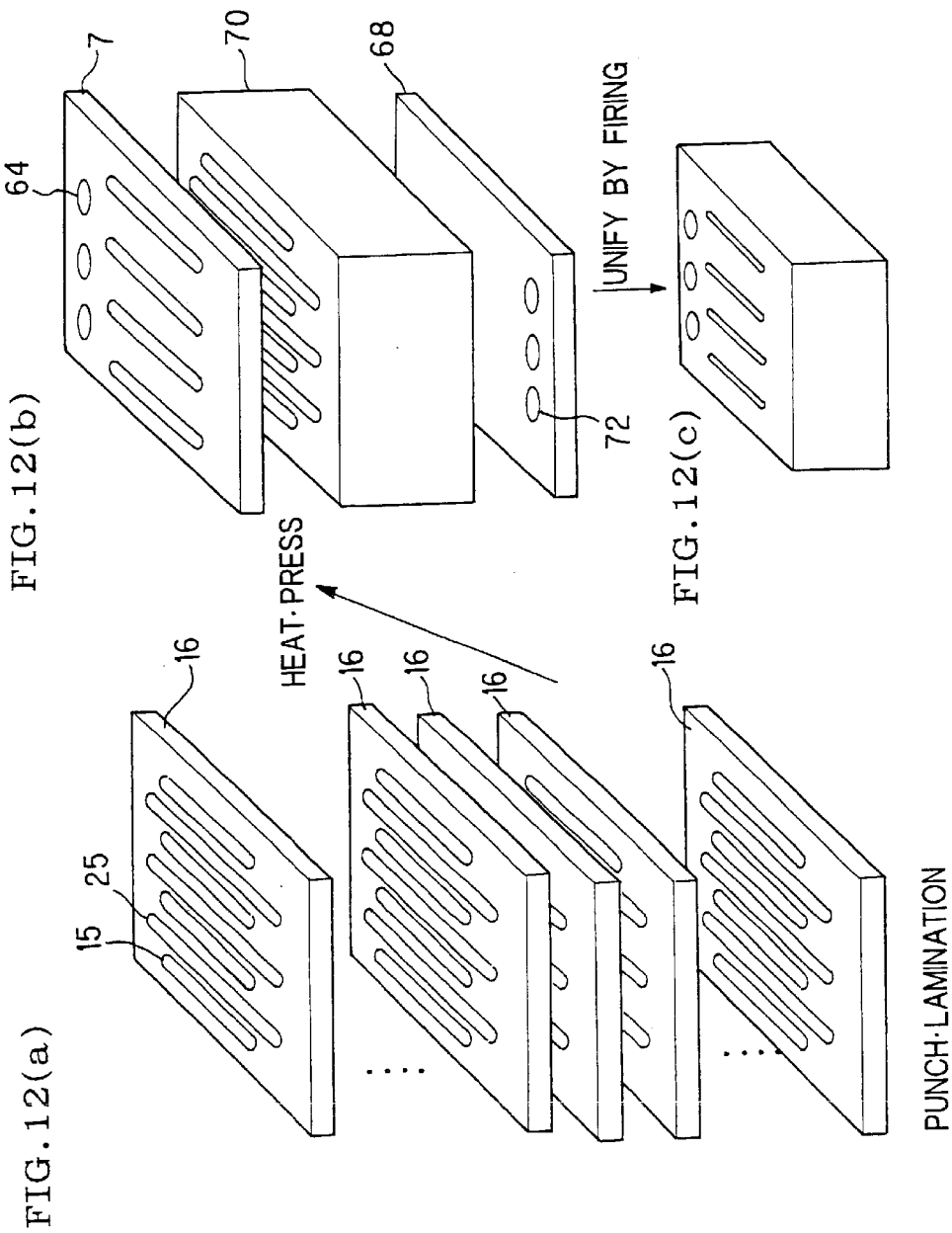
FIGS. 12(a) to 12(c) are schematic drawings showing a process in an another embodiment of a method for manufacturing a cell-driving-type micro pump member according to the invention.
Figure 13:
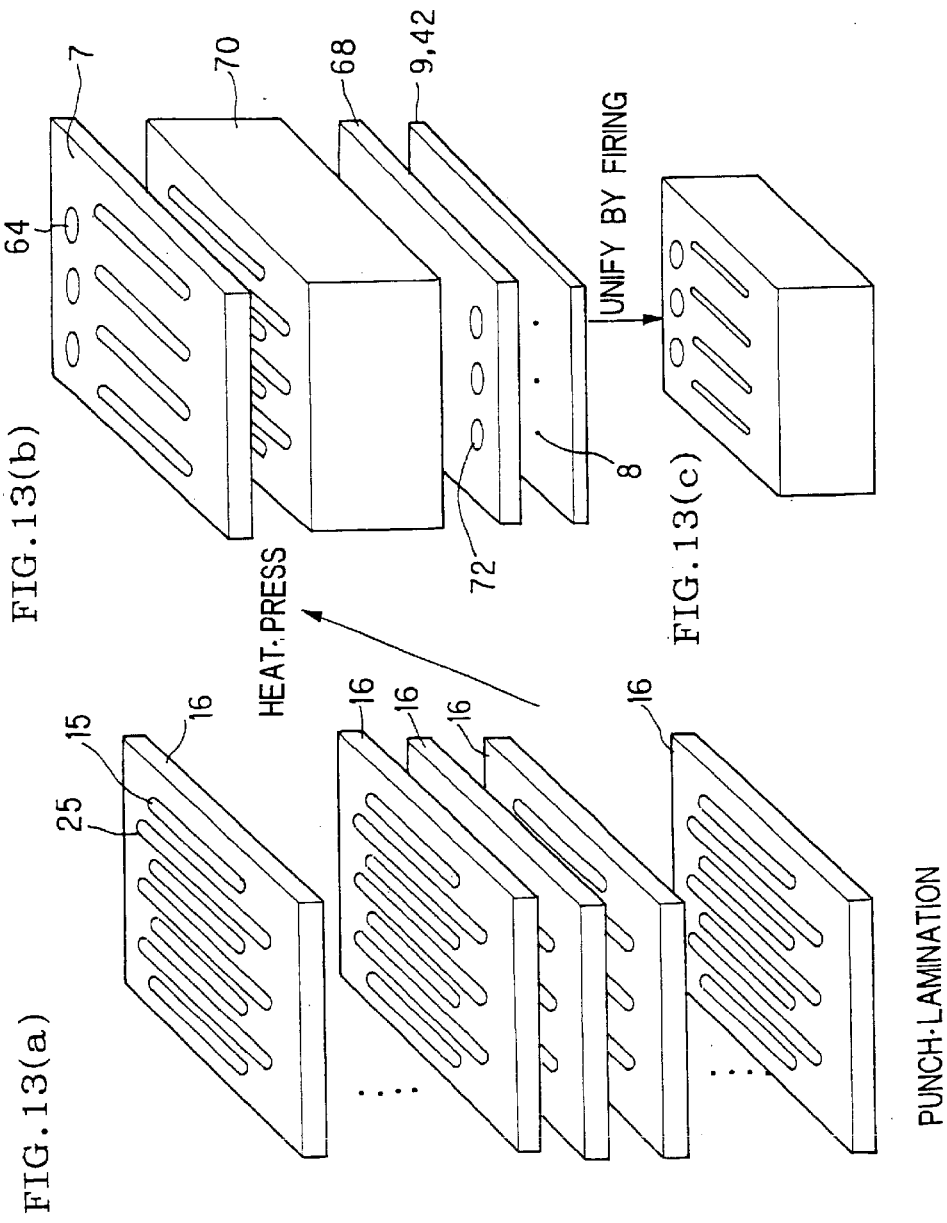
FIGS. 13(a) to 13(c) are schematic drawings showing a process in an another embodiment of a method for manufacturing a cell-driving-type micro pump member according to the invention.

As shown in FIGS. 3(a)–3(c), moreover, the cover plate 7 can be formed by a green sheet using the same material, and can be laminated together with the spacer plate 70, the connection plate 68 and the nozzle member 42, and then fired and thus unified. Since the cover plate 7 and the spacer plate 70 including the driving parts are simultaneously fired into a unified ceramic body, a high response micro pump member having an increased seal durability and an increased cell rigidity can be provided. In this case, the formation of electrodes is carried out by applying an electrode paste onto soft green sheets, and precautions must be made so as to neither damage nor cause deformation to the green sheets. It is also possible to form electrodes by flowing the electrode paste and drying it after firing and finishing the cell structure. In this case, however, difficult masking work arises, thereby being restricted to obtainable electrode patterns. Moreover, after the manufacturing process shown in FIGS. 12(a)–12(c), the process of bonding it to the liquid nozzle member 42 follows, but the description of the process is omitted.

Next, a second manufacturing method will be described. The second manufacturing method substantially follows the first manufacturing method, which is shown in FIGS. 4(a)–4(c). The second manufacturing method, in which a punch and a die are used, includes the steps of: punching a predetermined number of green sheets 16 made of piezoelectric/electrostrictive material with the punch to form slits; laminating the sheets and then providing piezoelectric/electrostrictive elements having a predetermined thickness as shown in FIG. 4(a). After that, similarly, for instance, in FIG. 4(b) the spacer plate 70 having the required slits 5 and slits 45 is formed after firing and unifying, and then electrodes are formed in the slits 5 which will become the cells, i.e., the pressurizing chambers. In FIG. 4(c), the cover plate 7, the connection plate 68 and the liquid nozzle member 42 are joined to the spacer 70.

The second manufacturing method is different from the first manufacturing method with respect to the process in which machining to form both slit apertures 25 which will later become the slits 5 and slit apertures 25 which will become the slits 45 in the green sheets 16 after lamination, in which case, the lamination is simultaneously carried out with the aid of a method which will be described later, and the lamination is completed at the end of punching, thus providing the piezoelectric/electrostrictive elements having a predetermined thickness.

FIGS. 6(a)–6(e) specifically show a method of simultaneous punching/lamination in the second manufacturing method, in which a die assembly consisting of a punch 10 and a die 12 together with a stripper 11 arranged at the surrounding thereof to carry out the lamination process of green sheets 16 (hereafter, also denoted as sheets) is used. FIG. 6(a) shows a state of laying a first sheet 16a on the die 12 before punching, and in FIG. 6(b) the slits are formed by lowering the punch 10 and the stripper 11, and then punching the sheet 16 (first step).

Then, the punching of a second sheet 16b is started. In this case, the first sheet 16a is moved upwards into tight contact with the stripper 11, and removed from the die 12 (second step). The tight contact of the sheets 16 with the stripper 11 can be achieved by evacuating air through suction holes formed in the stripper 11.

Moreover, in order to punch the second sheet 16b, the punch 10 and the stripper 12 are moved upwards from the die 12. In the course of this movement, it is desirable to move the front end of the punch 10 inside the slit apertures of the first sheet 16a, and it is important to stop the front end at a position slightly withdrawn from the lowest part of the first sheet 16a pulled together (third step). If the punch 10 is returned to the apertures or if it is completely inserted into the stripper 11, the apertures are deformed due to the softness of the sheets 16, thereby reducing the flatness of the side surfaces of the apertures in the course of forming the slits.

FIG. 6(d) shows the process of punching the second sheet 16b. The tight contact of the first sheet 16a with the stripper 11 permits laying the second sheet 16b on the die 12 with ease, and so the punching is carried out as the step in FIG. 6(b) and at the same time, the second sheet can easily be superimposed on the first sheet 16a (fourth step).

Repeating the processes in FIG. 6(c) and FIG. 6(d), the first punched sheet 16a is superimposed on the second punched sheet 16b, and are drawn up together with the stripper 11 (fifth step), thus becoming ready for punching the third sheet 16c. In this case, however, it is also important to stop the front end of the punch at a position slightly withdrawn from the lowest part of the sheets 16 pulled up together (sixth step). Then, a required number of the sheets 16 are punched and laminated by repeating the fourth step to the sixth step.

FIG. 6(e) shows the state of punching being finished. After the punching and laminating of a required number of the sheets 16 is finished, the holding of sheets 16 with the stripper 11 is released, and the sheets 16 punched and laminated can be removed from the stripper 11. The removing from the stripper 11 can be securely carried out by disposing a tool 17 for removing on the under face of the stripper 11, as shown in the drawing. The above-mentioned steps are used in the manufacturing method described in Japanese Patent Application No. 2000-280573. A laminated product having a predetermined thickness and desired number of slits can be provided with the above steps.

Figure 5A:
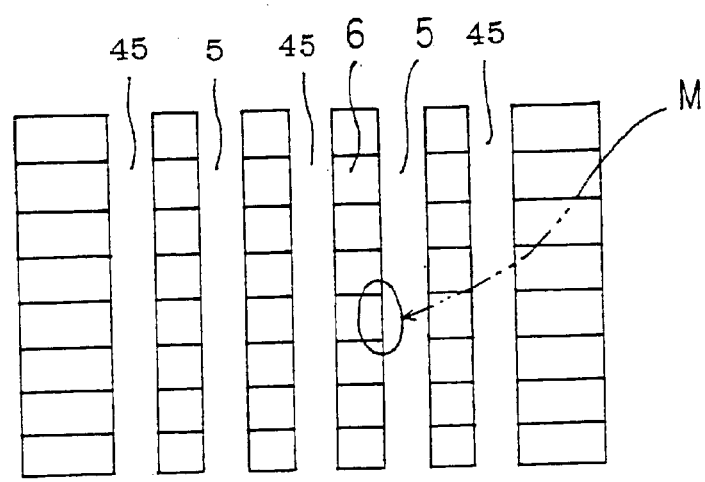
FIGS. 5(a) and 5(b) are drawings showing a second method for manufacturing a cell-driving-type micro pump member according to the invention, including the simultaneous punching and lamination.
Figure 5B:
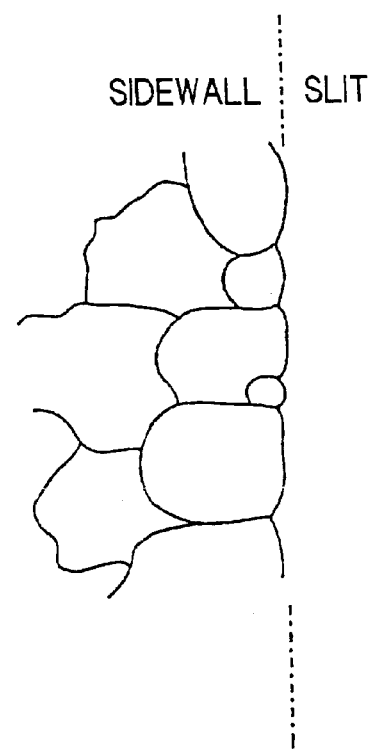

FIG. 5(a) shows an end surface of the spacer plate 70 after firing as shown in FIG. 4(b), when the second manufacturing method is employed to obtain the space plate 70 with the simultaneous punching/lamination method shown in FIGS. 6(a)–6(e). FIG. 5(b) schematically shows a magnified sectional view of part M on the wall surface of the slit 5 shown in FIG. 5(a).

In the method for manufacturing the cell-driving-type micro pump member according to the present invention, slits are formed after firing, so that the surfaces of the side walls of the slits, which will later become cells, that is, pressurizing chambers, are formed as a fired surface. When a micro pump member having substantially the same structure is manufactured with the processes of machining apertures and slits with a dicing unit or the like, after firing the piezoelectric/electrostrictive material as shown in FIGS. 18(a)–18(e), micro cracks and fractures inside grains as shown in FIG. 9(b) occur, e.g., on the surface of the side walls of the slits. In the method for manufacturing the cell-driving-type micro pump member according to the invention, such a situation does not occur, and the state of crystal grains on the surface of the side walls forming the pressurizing chambers indicates that the crystal grains suffering the transgranular fracture are 1% or less, which means substantially zero, so that the properties are not deteriorated and the durability and reliability can be enhanced. In addition, the fracture of corner parts (chipping) rarely takes place during machining, and since the dicing process is not used, it is not necessary to perform cleaning and drying processes.

As an example, the accuracy of superimposing the green sheets in the second method for manufacturing the cell-driving-type micro pump according to the invention is a max. of 4 µm regarding the deviation between the sheets after firing, in the case of the punched slits having a width of 50 µm and the slits having a width of 30 µm in the green sheets having a thickness of 50 µm and a Young's modulus of 39 N/mm², and laminating ten sheets thus treated, and the surface roughness Rt is approximately 7 µm. As shown in FIG. 5(b), the surfaces of the side walls are even and smooth. And the surfaces of the side walls are fired surfaces, so that no transgranular fracture occurs for the piezoelectric crystal grain even on the surfaces, and the crystal grains suffering transgranular fractures can be reduced to be 1% or less. Furthermore, the width of the slit after firing was approximately 40 µm due to shrinkage during the firing process.

As described above, the slit apertures are formed in the green sheets with the punch and die and at the same time, laminated, and then the punch itself is used as an axis for adjusting the position of the laminated green sheets, thereby preventing the slit apertures machined by the punch from deformation. Therefore, the slit apertures are not deformed, and the deviation between the laminated green sheets is suppressed so as to be 5 µm or less, thereby enabling the lamination to be carried out with high precision, and making it possible to produce smooth wall surfaces of the slits. As a result, slits having a slit width of even 70 µm or less and a high aspect ratio of 10–25, said slits forming the cells, that is, the pressurizing chambers, as well as the slits between the pressurizing chambers can be produced with ease, and thus a micro pump member having excellent properties can be obtained.

Moreover, since neither micro cracks nor fractured particles inside the grains exist on the surfaces of the side walls, the properties are not deteriorated due to the residual stress of compression. Since neither tools for moving the sheets nor space for laminating the sheets are required, the production line can be simplified, thereby providing a low cost of production.

In the first and second manufacturing methods, the firing is carried out after machining the slits, so that the slit width is substantially the same as the width of punching in the die assembly at the moment of punching the sheets. However, the slit is constricted during the firing. Accordingly, thin slits having a width of 40 µm or less can be produced by combining the technique of machining thin slits with the shrinkage due to the firing. In accordance with the design of a punching die assembly, for instance, changing the shape of the die assembly, slits having a shape other than shapes defined by straight lines can easily be produced, and an optimal shape adaptable to various applications can be attained, as shown in FIG. 10(c).

Moreover, in the second manufacturing method, it is possible to manufacture a micro pump member equipped with neither a connection plate nor a liquid nozzle member, and also to fire and unify the cover plate made from the same material as that of the spacer plate after laminating.

As described above in detail, the present invention solves the problems in the conventional art, thereby providing a cell-driving-type micro pump member on the basis of the piezoelectric/electrostrictive effect and a method for manufacturing the micro pump member, wherein heating processes at a high temperature can be employed; mass production at a low cost is feasible; the cells can be formed to have a slit part other than one defined by straight lines, the width of the slit part can be 60 µm or less, and a high aspect ratio can be obtained; the operation can be carried out with a high driving field strength; and a greater displacement and a higher response can be realized with a reduced field strength.

What is claimed is:

1. A cell-driving-type micro pump member, comprising:
   a plurality of cells formed in a base part defining a plurality of pressurizing chambers, said pressurizing chambers having side walls comprising piezoelectric/electrostrictive elements;
   wherein a volume of said pressurizing chambers is changed by a displacement of said piezoelectric/electrostrictive elements such that a pressure is produced in said pressurizing chambers;
   wherein each of said pressurizing chambers is independent with respect to adjacent pressurizing chambers; and
   wherein a ratio of spacing between adjacent ones of said pressurizing chambers to a height of said pressurizing chambers is in a range of approximately 1:2 to 1:40.

2. The cell-driving-type micro pump member according to claim 1, wherein said base part comprises a spacer plate consisting of piezoelectric/electrostrictive elements and having a plurality of first slits formed therein, a cover plate disposed on one side of said spacer plate positioned to cover said first slits, and a connection plate disposed on the other side of said spacer plate positioned to cover said first slits, wherein a plurality of second slits passing through said cover plate and said spacer plate are formed between adjacent ones of said first slits.

3. The cell-driving-type micro pump member according to claim 1 wherein the polarization field of said piezoelectric/electrostrictive elements is aligned in the same direction as the driving electric field.

4. The cell-driving-type micro pump member according to claim 1 wherein electrode films are formed on both surfaces of said side walls of said pressurizing chambers, and wherein said side walls expand and constrict when a voltage is applied to said electrode films.

5. The cell-driving-type micro pump member according to claim 1 wherein an inside width of said pressurizing chambers, or the spacing between adjacent ones of said pressurizing chambers, has at least two different distances.

6. The cell-driving-type micro pump member according to claim 1, wherein a reservoir is formed at a portion of at least one longitudinal end of said pressurizing chambers.

7. A liquid discharging device, including the cell-driving-type micro pump member according to claim 1, said liquid discharging device comprising:
   a liquid connecting opening disposed on a first surface of said pressurizing chambers;
   a liquid supplying opening disposed on a second surface of said pressurizing chambers; and
   a liquid nozzle member having a plurality of nozzle holes for ejecting droplet particles superimposed on said first surface of said pressurizing chambers such that said nozzle holes are connected to said pressurizing chambers;
   wherein said side walls of said pressurizing chambers expand and constrict when a driving electric field is applied in the same direction as the polarization field of the piezoelectric/electrostrictive elements, such that said pressurizing chambers are deformed and liquid supplied to said pressurizing chambers is ejected from said nozzle holes toward said first surface.

8. A liquid discharging device according to claim 7, wherein said first surface of said pressurizing chambers comprises an under face, said second surface of said pressurizing chambers comprises a top face, and said liquid supplied to said pressurizing chambers is ejected from said nozzle holes toward said under face.

9. A liquid discharging device including the cell-driving-type micro pump member according to claim 1 said liquid discharging device comprising:
   a liquid supplying opening and a liquid connecting opening disposed on a first surface of said pressurizing chambers;
   a liquid supplying channel connected to said liquid supplying opening disposed on said first surface of said pressurizing chambers; and
   a liquid nozzle member having a plurality of nozzle holes for ejecting droplet particles superimposed on said first surface of said pressurizing chambers such that said nozzle holes are connected to said pressurizing chambers;
   wherein said side walls of the pressurizing chambers expand and constrict when a driving electric field is applied in the same direction as that of the polarization field of the piezoelectric/electrostrictive elements such that said pressurizing chambers are deformed and liquid supplied to said pressurizing chambers is ejected from said nozzle holes toward said first surface.

10. A liquid discharging device according to claim 9, wherein said first surface of said pressurizing chambers comprises an under face, the other surface of said pressurizing chambers comprises a top face, and liquid supplied to said pressurizing chambers is ejected from said nozzle holes toward said under face.

11. A cell-driving-type micro pump member, comprising:
    a plurality of cells formed in a base part defining a plurality of pressurizing chambers, said pressurizing chambers having side walls comprising piezoelectric/electrostrictive elements;
    wherein a volume of said pressurizing chambers is changed by a displacement of said piezoelectric/electrostrictive elements such that a pressure is produced in said pressurizing chambers;
    wherein each of said pressurizing chambers is independent with respect to adjacent pressurizing chambers; and
    wherein 1% or less of crystal grains present on the surfaces of said side walls of said pressurizing chambers suffer transgranular fracture.

12. A cell-driving-type micro pump member, comprising:
    a plurality of cells formed in a base part defining a plurality of pressurizing chambers, said pressurizing chambers having side walls comprising piezoelectric/electrostrictive elements;
    wherein a volume of said pressurizing chambers is changed by a displacement of said piezoelectric/electrostrictive elements such that a pressure is produced in said pressurizing chambers;
    wherein each of said pressurizing chambers is independent with respect to adjacent pressurizing chambers; and
    wherein said surfaces of said pressurizing chamber have a surface profile degree of approximately 8 $\mu$m or less.

13. A cell-driving-type micro pump member, comprising:
    a plurality of cells formed in a base part defining a plurality of pressurizing chambers, said pressurizing chambers having side walls comprising piezoelectric/electrostrictive elements;
    wherein a volume of said pressurizing chambers is changed by a displacement of said piezoelectric/electrostrictive elements such that a pressure is produced in said pressurizing chambers;
    wherein each of said pressurizing chambers is independent with respect to adjacent pressurizing chambers; and
    wherein a ratio of an inside width of said pressurizing chambers to a height of said pressurizing chambers is in a range of approximately 1:2 to 1:40.

14. A cell-driving-type micro pump member, comprising:
    a plurality of cells formed in a base part defining a plurality of pressurizing chambers, said pressurizing chambers having side walls comprising piezoelectric/electrostrictive elements;
    wherein a volume of said pressurizing chambers is changed by a displacement of said piezoelectric/electrostrictive elements such that a pressure is produced in said pressurizing chambers;
    wherein each of said pressurizing chambers is independent with respect to adjacent pressurizing chambers; and
    wherein an inside width of said pressurizing chambers is approximately 60 $\mu$m or less.

15. A cell-driving-type micro pump member, comprising:
    a plurality of cells formed in a base part defining a plurality of pressurizing chambers, said pressurizing chambers having side walls comprising piezoelectric/electrostrictive elements;

wherein a volume of said pressurizing chambers is changed by a displacement of said piezoelectric/electrostrictive elements such that a pressure is produced in said pressurizing chambers;

wherein each of said pressurizing chambers is independent with respect to adjacent pressurizing chambers; and wherein the spacing between adjacent ones of said pressurizing chambers is approximately 50 μm or less.

16. A cell-driving-type micro pump member, comprising:

a plurality of cells formed in a base part defining a plurality of pressurizing chambers, said pressurizing chambers having side walls comprising piezoelectric/electrostrictive elements;

wherein a volume of said pressurizing chambers is changed by a displacement of said piezoelectric/electrostrictive elements such that a pressure is produced in said pressurizing chambers;

wherein each of said pressurizing chambers is independent with respect to adjacent pressurizing chambers; and wherein a surface roughness Rt of said side walls of said pressurizing chambers is approximately 10 μm or less.

* * * * *